(12) United States Patent
Rabinovitch et al.

(10) Patent No.: US 9,910,944 B2
(45) Date of Patent: Mar. 6, 2018

(54) X-PROPAGATION IN EMULATION USING EFFICIENT MEMORY

(71) Applicant: Synopsys, Inc., Mountain View, CA (US)

(72) Inventors: Alexander Rabinovitch, Shrewsbury, MA (US); Ludovic Marc Larzul, Folsom, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/670,962

(22) Filed: Aug. 7, 2017

(65) Prior Publication Data

US 2017/0337310 A1 Nov. 23, 2017

Related U.S. Application Data

(63) Continuation of application No. 14/602,580, filed on Jan. 22, 2015, now Pat. No. 9,773,078.

(51) Int. Cl.
*G06F 11/22* (2006.01)
*G06F 17/50* (2006.01)

(52) U.S. Cl.
CPC ...... *G06F 17/5027* (2013.01); *G06F 17/5081* (2013.01)

(58) Field of Classification Search
CPC .......................... G06F 17/5027; G06F 17/5081
See application file for complete search history.

(56) References Cited

U.S. PATENT DOCUMENTS

| 5,428,579 A * | 6/1995 | Robinson ............ G06F 12/0684 365/185.33 |
| 5,872,953 A | 2/1999 | Bailey |
| 2003/0040898 A1 | 2/2003 | McWilliams et al. |
| 2004/0264286 A1 | 12/2004 | Ware et al. |
| 2005/0010880 A1 | 1/2005 | Schubert et al. |
| 2006/0015313 A1 | 1/2006 | Wang et al. |
| 2008/0300849 A1* | 12/2008 | Nicholas ............ G06F 17/5022 703/15 |
| 2008/0301596 A1 | 12/2008 | Kneisel et al. |
| 2010/0161306 A1 | 6/2010 | Burgun et al. |
| 2010/0229061 A1 | 9/2010 | Hapke et al. |

(Continued)

OTHER PUBLICATIONS

Taiwan Office Action, Taiwan Application No. 104138288, dated Oct. 21, 2016, 10 pages.

(Continued)

*Primary Examiner* — Nha Nguyen
(74) *Attorney, Agent, or Firm* — Fenwick & West LLP

(57) ABSTRACT

Embodiments relate to the emulation of circuits, and representation of unknown states of signals. A disclosed system (and method and computer program product) includes an emulation environment to convert a digital signal of a DUT in a form capable of representing an unknown state. In addition, the disclosed system converts digital logic circuits such as Boolean logic, flip flops, latches, and memory circuits to be operable with signals having unknown states. Thus, an unknown state of a signal is indicated and propagated through digital logic circuits represented in a disclosed semantic to enable prompt detection of improper operation of the DUT, for example, due to power shut down or inadequate initialization.

20 Claims, 12 Drawing Sheets

(56) References Cited

U.S. PATENT DOCUMENTS

2012/0131386 A1    5/2012   Fournier et al.
2013/0085720 A1    4/2013   Xie et al.

OTHER PUBLICATIONS

PCT International Search Report and Written Opinion, PCT Application No. PCT/US15/58173, dated Mar. 11, 2016, 19 pages.
PCT Invitation to Pay Additional Fees, PCT Application No. PCT/US15/58173, dated Dec. 30, 2015, 2 pages.
Verification Horizons: A Quarterly Publication of Mentor Graphics, T. Fitzpatrick, ed., Q2 '07, vol. 3, Issue 2, 44 pages.
United States Office Action, U.S. Appl. No. 14/602,580, Mar. 9, 2017, 13 pages.

\* cited by examiner

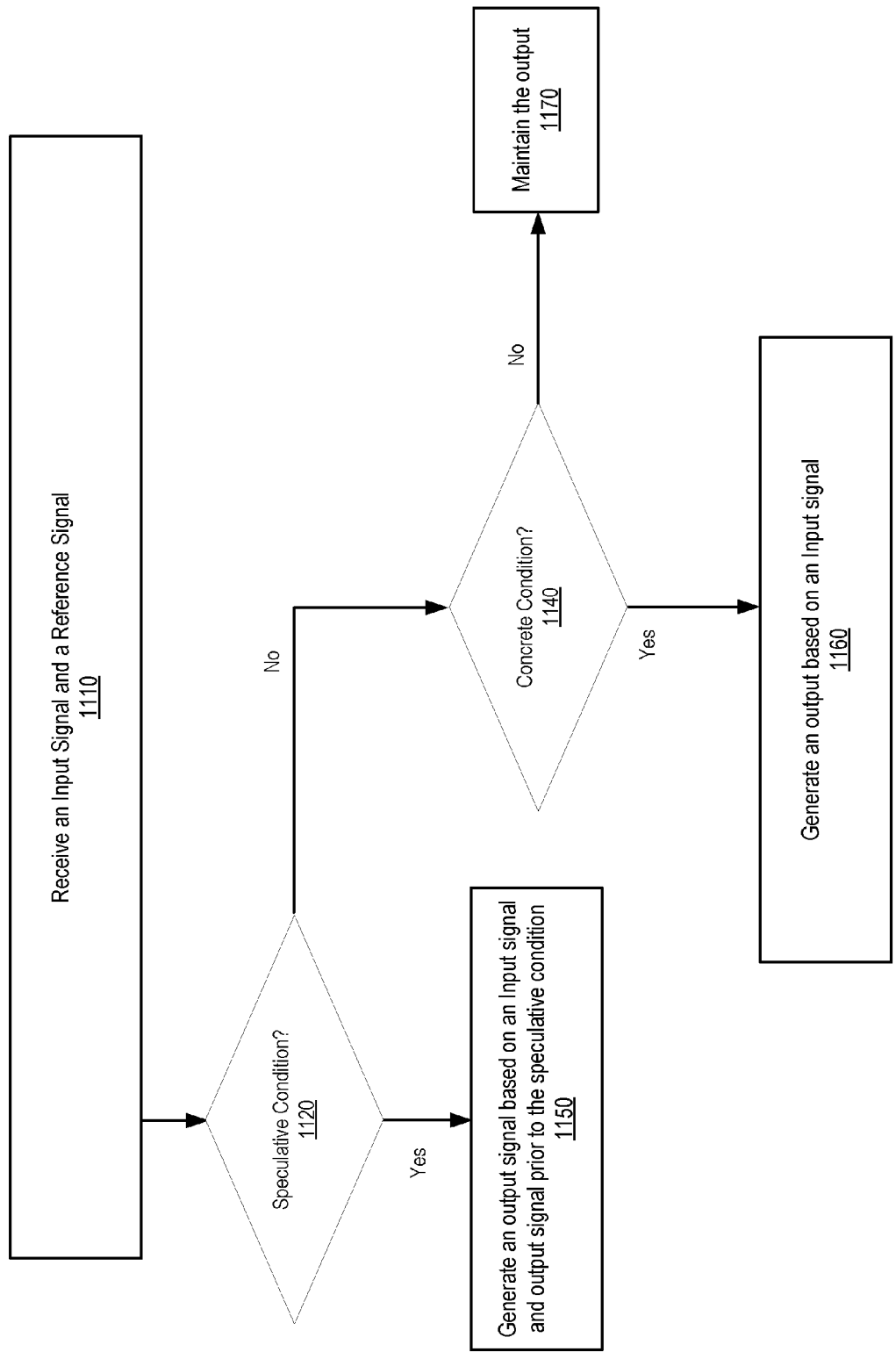

X-PROPAGATION IN EMULATION USING EFFICIENT MEMORY

CROSS REFERENCE TO RELATED APPLICATIONS

This application is a continuation of U.S. application Ser. No. 14/602,580, filed Jan. 22, 2015, which is incorporated by reference in its entirety.

BACKGROUND

The disclosure generally relates to the emulation of circuits, and more specifically to promptly identifying unpredictable behavior of a digital system.

DESCRIPTION OF THE RELATED ART

Emulators have been developed to assist circuit designers in designing and debugging highly complex integrated circuits. An emulator includes multiple reconfigurable components, such as field programmable gate arrays (FPGAs) that together can imitate the operations of a design under test (DUT). By using an emulator to imitate the operations of a DUT, designers can verify that a DUT complies with various design requirements prior to a fabrication.

One aspect of emulation includes identifying functionality of a DUT. In one approach, identifying functionality of a DUT involves emulating a DUT and analyzing signals from the emulated DUT to verify improper, uncertain or unknown operations. For example, in case of power shut down or improper initialization, registers or logic circuits in the DUT are not properly terminated and states of those registers or logic circuits become unknown. During the operation of the DUT, the unknown states may cause improper logic operations, and the results of the improper logic operations may further affect other logic circuits to operate incorrectly throughout the DUT.

In a conventional approach, a digital signal is represented in a binary state (e.g., high or low) and identifying improper or unknown operations of the DUT involves performing emulation of the DUT until inappropriate or uncertain outcomes are detected at outputs of the DUT. In advanced processes (e.g., 22 nanometers (nm) and below), a DUT may include billions of logic circuits and signals. As a result, identifying unknown operations of a DUT may involve performing a large number of digital logic operations until improper logic operations are propagated at outputs because of unknown states, which may be a time consuming process. As a result, locating sources of unknown states and debugging them are inefficient.

Therefore, there is a need for an approach for identifying uncertainties of the operation of the DUT in a time efficient manner in terms of emulation cycles performed.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

Figure (FIG. 1 is a block diagram of an emulation environment, according to one embodiment.

FIG. 11 is a flow chart illustrating an operation of a flip flop or a latch based on a speculative condition and a concrete condition of a reference signal, according to one embodiment.

DETAILED DESCRIPTION

Figure 1:
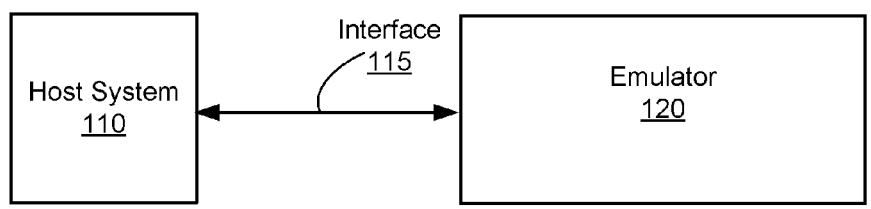

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. The figures depict embodiments of the disclosed system (or method) for purposes of illustration only. It should be recognized from the following description that alternative embodiments of the structures and methods illustrated herein may be employed without departing from the principles described herein.

Configuration Overview

A disclosed system (and method and computer program product) includes an emulation environment capable of indicating an unknown state of a signal and performing digital logic operations accordingly for improving the speed and performance of identifying improper or unknown operations of a DUT. In the disclosed system (and method and computer program product), an unknown state of a signal is indicated and propagated through digital logic circuits represented in a disclosed semantic to enable prompt identification of improper operation of the DUT, for example, due to power shut down or inadequate initialization.

An improper or unknown operation of a DUT herein refers to an operation of the DUT that renders an output of the DUT to become unknown or incorrect compared to its expected output, due to any signal of the DUT having an unknown state.

One embodiment of the emulation environment includes a host system and an emulator. The host system configures the emulator to load a design under test (DUT), and the emulator emulates the DUT accordingly. The host system converts a DUT or a portion of the DUT according to conversion rules to enable representation of an unknown state of a signal of the DUT and propagation of the unknown state. Signals and logic circuits (combinational and sequential circuits) in a DUT are converted such that uncertainty of input signals can be carried onto output of the logic circuits. In one embodiment, a conversion of signals and logic circuits is performed at a register transfer language (RTL) level. Alternatively, a conversion of signals and logic circuits may be performed at a gate/transistor level or any other level.

In one approach, the host system converts a single bit of a digital signal of a DUT represented in a two state semantic into at least two bits in a three or four state semantic (herein referred to as "four state semantic") to enable representation of an unknown state. In one implementation, a first bit indicates a possible low state or a possible high state of a signal, and a second bit indicates whether the state of the signal is known or unknown. In another implementation, a first bit indicates a possible high state and a second bit indicates a possible low state. In both implementations, a combination of at least two bits enables representation of an unknown state of a signal.

In addition, the host system converts Boolean logic operators according to conversion rules to determine outputs of the converted Boolean logic operators and uncertainties of the outputs based on input signals represented in the four state semantic. When a state of an input signal in the four state semantic is unknown, a state of an output of a converted Boolean logic operator and a certainty of the state of the output are determined based on a known state (e.g., high or low) of another input signal. Therefore, unknown states are propagated promptly through the converted Boolean logic operators.

Moreover, the host system converts edge operators (e.g., flip flop) according to conversion rules to enable operation of the edge operators with a speculative transition including a transition in the state of a reference signal from an unknown state or to the unknown state represented in the four state semantic. A speculative transition herein refers to a transition in a reference signal that may have triggered an operation of a flip flop because of an uncertainty of the state in the reference signal. For example, for a rising edge triggered flip flop, a speculative transition occurs when the reference signal transitions from a low state to an unknown state, or from an unknown state to a high state. The converted flip flop generates an output signal based on a concrete transition (i.e., not speculative) or a speculative transition of a reference signal.

Additionally, the host system converts latches according to conversion rules to enable operations of the latches with a reference signal having an unknown state represented in the four state semantic. The converted latch generates an output signal based on a reference signal having a concrete state (i.e., known state) or an unknown state.

Furthermore, the host system converts a memory circuit according to conversion rules to perform read and write operations based on an ambiguous address signal. The ambiguous address signal includes at least one bit having an unknown state. The bit having the unknown state may be represented with two or more bits after a conversion with the disclosed semantic. In one aspect, the converted memory circuit implements memory indicators, where each memory indicator is associated with its corresponding content and its corresponding address indicated by an address signal. A memory indicator indicates an uncertainty of a corresponding content associated with the memory indicator.

Example Emulation Environment

Figure (FIG. 1 is a block diagram illustrating an emulation environment 100, according to one embodiment. The emulation environment 100 includes a host system 110 and an emulator 120. The host system 110 communicates with the emulator 120 through an interface 115.

The host system 110 configures the emulator 120 for emulating a DUT and communicates with the emulator 120 during emulation of the DUT. A DUT is one or more circuit designs that are to be emulated by the emulator 120. The host system 110 may be a single computer or a collection of multiple computers.

In one embodiment, the host system 110 receives from a user a description of a DUT to be emulated. The description of the DUT is in a type of hardware description language (HDL), for example, register transfer language (RTL). The host system 110 converts the DUT or a portion of the DUT to enable representing an unknown state of a signal of the DUT. Preferably, the host system 110 converts signals in a conventional two state semantic into a four state semantic to represent an unknown state of the signal of the DUT. In addition, the host system 110 converts digital logic circuits including, but are not limited to, Boolean logic operators, flip flops, latches, and memory circuits to enable operation with signals represented in the four state semantic.

The host system 110 creates a gate level netlist based on the HDL description of the converted DUT according to the four state semantic. The host system 110 uses the gate level netlist to partition the converted DUT and maps each partition to one or more logic circuits included in the emulator 120. The host system 110 transmits a gate level description of the converted DUT in one or more bit streams to the emulator 120 through the interface 115. The bit streams may include representations of the gate level logic of the converted DUT, partitioning information, mapping information, and design constraints for configuring the emulator 120.

In an alternative embodiment, the host system 110 transmits the HDL description of the converted DUT according to the four state semantic to the emulator 120 through the interface 115.

In another alternative embodiment, the host system 110 receives from a user a description of a DUT in gate level logic. In addition, the host system 110 converts the DUT or a portion of the DUT in the gate level logic according to the four state semantic to enable representation of an unknown state of a signal of the DUT. Similarly, the host system 110 transmits bit streams including representations of the gate level logic of the converted DUT to the emulator 120.

In one approach, a portion of the DUT is predefined in a block/IP level hardware component. Alternatively, a user is able to select a portion of the DUT to be converted into the four state semantic. In addition, a portion of the DUT may be represented in both two state semantic and four state semantic to emulate both in parallel for faithfully preserving the desired behavior.

Additionally, during emulation of the DUT by the emulator 120, the host system 110 receives emulation results from the emulator 120 through the interface 115. Emulation results are information transmitted by the emulator 120 based on the emulation of the DUT. The emulation results include information describing the states of multiple signals in the DUT during the emulation. For example, the emulator 120 transmits the emulation results in the four state semantic, and the host system 110 converts the emulation results from the emulator 120 into the two state semantic. In another example, the emulator 120 converts the emulation results in the four state semantic into the two state semantic prior to the transmission to the host system 110.

The emulator 120 is a hardware system that emulates DUTs. The emulator 120 includes multiple configurable logic circuits that together can emulate a DUT. In one embodiment, the logic circuits included in the emulator 120 are field-programmable gate arrays (FPGAs).

For a DUT that is to be emulated, the emulator 120 receives from the host system 110 one or more bit streams including a gate level description of the converted DUT according to the four state semantic to represent unknown states of signals in the DUT. The bit streams further describe partitions of the DUT created by the host system 110, mappings of the partitions to the FPGAs of the emulator 120, and design constraints. In an alternative embodiment, the emulator 120 receives bit streams including HDL level description of the converted DUT. Based on the bit streams, the emulator 120 configures the FPGAs to perform the functions of the DUT.

The emulator 120 emulates the converted DUT according to the four state semantic to represent unknown states of signals in the DUT. Based on the emulation, the emulator 120 generates emulation results, which are transmitted to the host system 110 for analysis.

The interface 115 is a communication medium that allows communication between the host system 110 and the emulator 120. In one embodiment, the interface 115 is a cable with electrical connections. For example, the interface 115 may be an RS232, USB, LAN, optical, or a custom built cable. In other embodiment, the interface 115 is a wireless communication medium or a network. For example, the interface 115 may be a wireless communication medium employing a Bluetooth® or IEEE 802.11 protocol.

Figure 2:
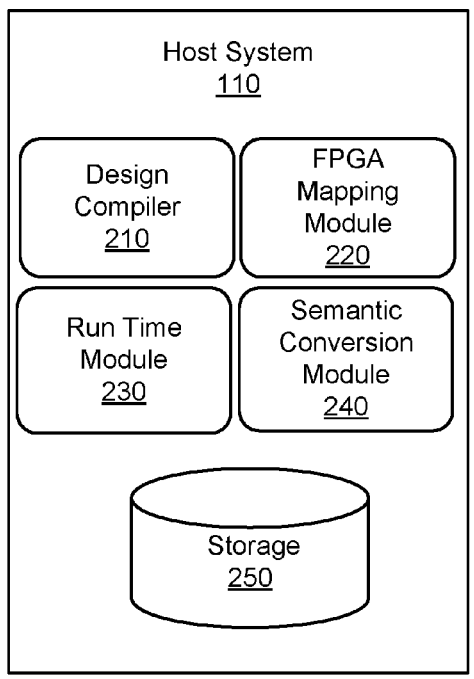
FIG. 2 is a block diagram illustrating a host system, according to one embodiment.

FIG. 2 is a block diagram illustrating the host system 110 in more detail, according to one embodiment. The host system 110 includes a design compiler 210, FPGA mapping module 220, run time module 230, semantic conversion module 240, and storage 250. Each of these components may be embodied as hardware, software, firmware, or a combination thereof. Together these components provide designs to configure the emulator 120 and monitor the emulation results based on unknown states of signals.

In one embodiment, the design compiler 210 converts HDL of DUTs into gate level logic. For a DUT that is to be emulated, the design compiler 210 receives a description of the DUT in HDL (e.g., RTL or other level of abstraction). The design compiler 210 synthesizes the HDL of the DUT to create a gate level netlist with a description of the DUT in terms of gate level logic.

The mapping module 220 partitions DUTs and maps partitions to emulator components. After the design compiler 210 creates a gate level netlist, the mapping module 220 partitions the DUT at the gate level into a number of partitions using the netlist. The mapping module 220 maps each partition to one or more FPGAs of the emulator 120. The mapping module 220 performs the partitioning and mapping using design rules, design constraints (e.g., timing or logic constraints), and information about the emulator 120. For each partition, the mapping module 220 generates a bit stream describing the logic circuits included in the partition and the mapping to one or more FPGAs of the emulator 120. The bit streams may also include information about connections between components and other design information. The mapping module 220 transmits the bit streams to the emulator 120, so that the FPGAs of the emulator 120 can be configured for emulating the DUT.

The run time module 230 controls emulations performed on the emulator 120. The run time module 230 may cause the emulator 120 to start or stop executing the emulations. Additionally, the run time module 230 may provide input signals/data to the emulator 120. The input signals may be provided directly to the emulator 120 through the interface 115 or indirectly through other input signal devices. For example, the host system 110 with the run time module 230 may control an input signal device such as a test board, a signal generator, or a power supply, to provide the input signals to the emulator 120.

In one embodiment, the run time module 230 may receive emulation results from the emulator 120. In one implementation, the run time module 230 receives emulation results in the two state semantic and/or the four state semantic. The run time module 230 may also convert the received emulation results into the four state semantic or the two state semantic.

The storage 250 is a repository for saving information used to configure the emulator 120 to load a DUT, or information on the emulation of the DUT performed on the emulator 120. The storage 250 contains, a DUT or a portion of the DUT in at least one of HDL and netlist descriptions, represented in the two state semantic and/or the four state semantic. In addition, the storage 250 contains design rules, design constraints (e.g., timing or logic constraints), and information about the emulator 120 to be used by the mapping module 220 for mapping, and a bit stream generated from the mapping. Moreover, the storage 250 contains conversion rules to be used by the semantic conversion module 240. Additionally, the storage 250 stores emulation results received from the emulator 120.

The semantic conversion module 240 converts a DUT according to conversion rules to represent unknown states of signals of the DUT. The semantic conversion module 240 performs conversions of signals to enable representation of unknown states. Additionally, the semantic conversion module 240 converts logic circuits including, but are not limited to, Boolean logic operators, flip flops, latches, and memory circuits to be operable with the representations of unknown states of signals, as described in detail with respect to FIGS. 4 through 7. The semantic conversion may be performed on the entire DUT or a portion of the DUT according to conversion rules.

Figure 3:
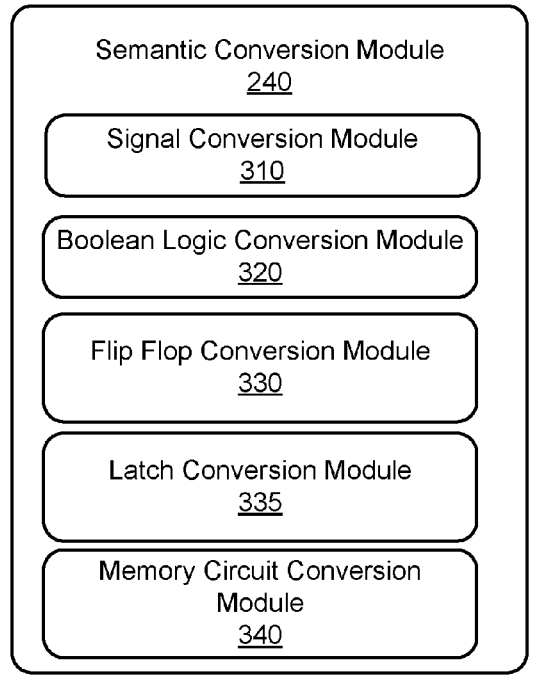
FIG. 3 is a block diagram of a semantic conversion module, according to one embodiment.

Referring to FIG. 3, illustrated is a detailed block diagram of the semantic conversion module 240, according to one embodiment. In one embodiment, the semantic conversion module 240 includes a signal conversion module 310, Boolean logic conversion module 320, flip flop conversion module 330, latch conversion module 335, and memory circuit conversion module 340. The signal conversion module 310 converts signals of a DUT in a format capable of representing unknown states. In addition, the Boolean logic conversion module 320 converts Boolean logic circuits of the DUT to enable logic operations with signals having unknown states. Additionally, the flip flop conversion module 330 converts flip flops of the DUT to enable operations of the flip flops based on speculative transitions of reference signals due to unknown states of the reference signals. Furthermore, the latch conversion module 335 converts latches of the DUT to enable latch operations with reference signals having unknown states. Moreover, the memory circuit conversion module 340 converts memory circuits of the DUT to be operable based on ambiguous address signals including at least one bit with an unknown state. Together, these components covert the DUT or a portion of the DUT into the four state semantic to enable representations of unknown states of signals and propagation of the unknown states.

The signal conversion module 310 converts a digital signal of a DUT represented in a two state semantic to enable a representation of an unknown state of a signal. A signal is represented in one or more bits. A single bit is represented by an output of a register or another logic circuit. Each bit has a binary state such as a high state (herein also referred to as logic 1, VDD, and TRUE) and a low state (herein referred to as logic 0, GND, and FALSE). The signal conversion module 310 implements at least two bits for representing one bit in the two state semantic to represent an unknown state (herein also referred to as logic X, unclear, and uncertain). Preferably, the signal conversion module 310 implements two bits for representing an unknown state of a one bit of a signal in two state semantic. In one approach, the semantic conversion is achieved by using basic circuits or logic blocks used in two state semantic as described in detail with respect to FIGS. 4 through 7.

Figure 4A:
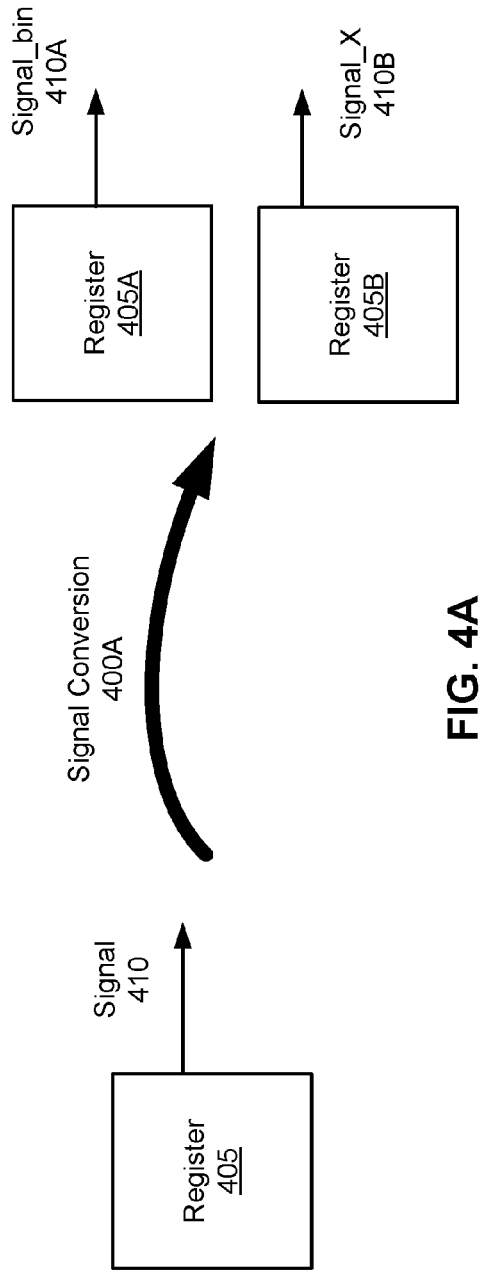
FIG. 4A is an example conversion of a signal implemented on the emulator, according to one semantic representation.

In FIG. 4A, one example embodiment of a signal conversion 400A performed by the signal conversion module 310 is illustrated. In this example, a signal 410 is represented in a single bit using a register 405 in the two state semantic. According to the signal conversion 400A, an additional bit using an additional register is implemented to represent the signal 410 in a four state semantic. In one aspect, a first register 405A is implemented to represent a bit signal_bin 410A for indicating a possible low state or a possible high state of the signal 410. In addition, a second register 405B is implemented to represent a bit signal_X 410B for indicating whether the state of the signal is known or unknown. In this four state semantic, when the bit signal_X 410B is in a low state (e.g., the state of the signal 410 is known), the state of the signal 410 is as indicated by the bit signal_bin 410A. In case the bit signal_X 410B is in a high state (e.g., the state of the signal 410 is unknown), the signal 410 is represented to have an unknown state. The signal conversion 400A can be implemented according to an example Verilog code below.

Table 1 shows one approach in a signal conversion, as explained with respect to FIG. 4A.

| Convention 1 |
| --- |
| r===1'bX iff r_X==1; (r_bin is don't care in this case) |
| r===1'b0 iff r_X==0 and r_bin==0; |
| r===1'b1 iff r_X==0 and r_bin==1; |

Figure 4B:
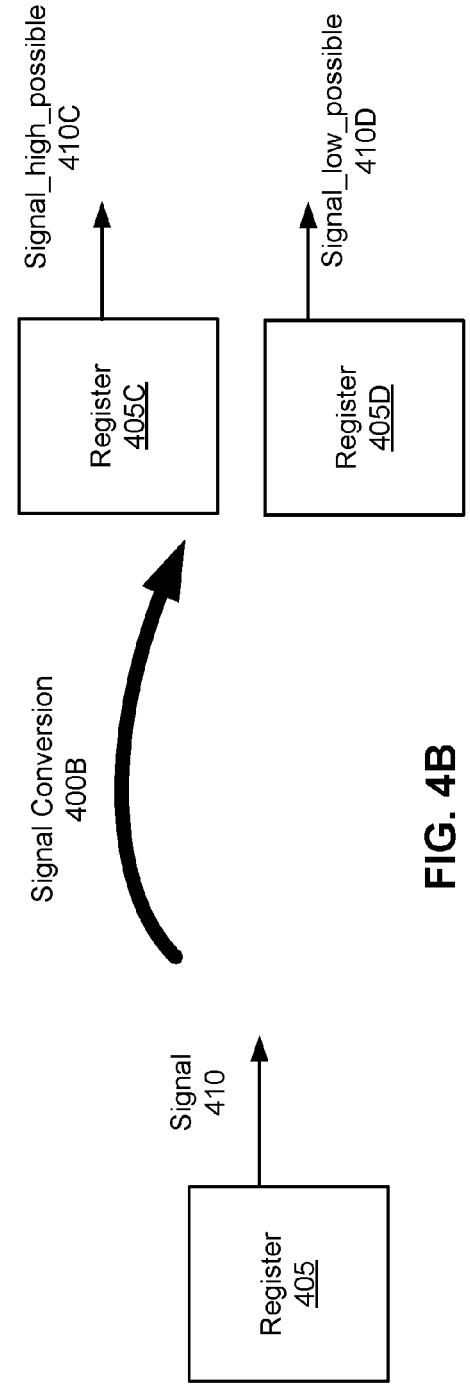
FIG. 4B is another example conversion of a signal implemented on the emulator, according to another semantic representation.

In FIG. 4B, another example embodiment of a signal conversion 400B performed by the signal conversion module 310 is illustrated. According to the signal conversion 400B, an additional bit using an additional register is implemented to represent the signal 410 in a four state semantic. In this approach, a first register 405C is implemented to represent a bit signal_high_possible 410C for indicating a possible high state of the signal 410. In addition, a second register 405D is implemented to represent a bit signal_low_possible 410D for indicating a possible low state of the signal 410. In this four state semantic, when both bits the signal_high_possible 410C and the signal_low_possible 410D are in high states, the signal 410 is represented to have an unknown state. When the bit signal_high_possible 410C is in a high state and the bit signal_low_possible 410D is in a low state, the signal 410 is represented to have a high state. Similarly, when the bit signal_high_possible 410C is in a low state and the bit signal_low_possible 410D is in a high state, the signal 410 is represented to have a low state. When both bits the signal_high_possible 410C and the signal_low_possible 410D are in low states, the signal 410 may be represented to have an unknown state, or an unassigned state (i.e., does not affect the logic operation). The signal conversion 400B can be implemented according to an example Verilog code below.

Table 2 shows another approach in a signal conversion, as explained with respect to FIG. 4B.

| Convention 2 |
| --- |
| r===1'bX iff r_1_possible==1 and r_0_possible ==1; |
| r===1'b0 iff r_1_possible==0 and r_0_possible ==1; |
| r===1'b1 iff r_1_possible==1 and r_0_possible ==0; |

Figure 5:
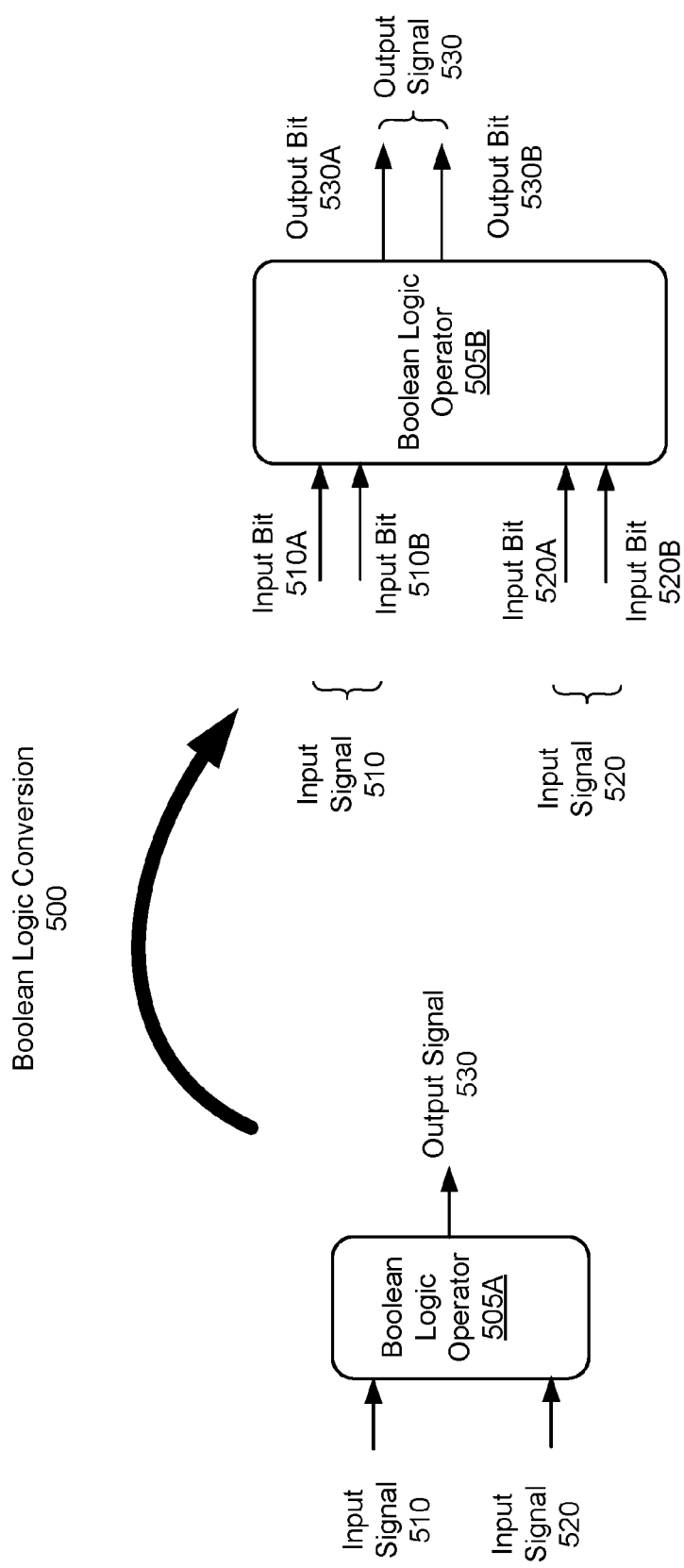
FIG. 5 is an example conversion of a Boolean logic circuit, according to one embodiment.

In FIG. 5, an example embodiment of a Boolean logic conversion 500 performed by the Boolean logic conversion module 320 is illustrated. The Boolean logic conversion module 320 converts Boolean logic operators according to conversion rules to determine outputs of the converted Boolean logic operators and uncertainties of the outputs based on input signals having unknown states.

As an example illustrated in FIG. 5, the Boolean logic conversion 500 transforms Boolean logic operator 505A into converted Boolean logic operator 505B for performing logic operations with signals having unknown states. In this example, the Boolean logic operator 505A in two state semantic performs Boolean logic operation based on input signals 510 and 520 to generate an output signal 530, where each signal is represented in a single bit. The Boolean logic conversion 500 is performed such that the Boolean logic operator 505B receives input signals 510 and 520, and generates an output signal 530 in any one of the four state semantics as explained with respect to FIGS. 4A and 4B. According to any one of the signal conversions 400A and 400B (herein referred to as a signal conversion 400), the input signal 510 is represented with input bits 510A, 510B, the input signal 520 is represented with input bits 520A, 520B, and the output signal 530 is represented with output bits 530A, 530B. For simplicity, the Boolean logic conversion 500 in FIG. 5 is performed on a Boolean logic operator 505A with two input signals 510 and 520. However, the Boolean logic conversion 500 may be performed on other logic circuits with more than two input signals to determine a state of one or more output signals and uncertainty of the one or more output signals.

The Boolean logic operator 505B determines a state of the output signal 530 and uncertainty of the state of the output signal 530 based on states of the input signals 510 and 520. For example, in case the Boolean Logic operator 505A is AND or NAND logic and a state of the input signal 510 is unknown, the output signal 530 is determined to be unknown responsive to the input signal 520 having a high state. In another example, in case the Boolean logic operator 505A is OR or NOR logic and a state of the input signal 510 is unknown, the output signal 530 is determined to be unknown responsive to the input signal 520 having a low state. In another example, in case the Boolean logic operator 505A is XOR, XNOR, XAND, or XNAND logic, the output signal 530 is determined to be unknown responsive to any one of the input signals 510 and 520 having an unknown state. In this manner, unknown states may be propagated through the converted Boolean logic operators 505B. An example Boolean logic conversion 500 of AND logic can be implemented according to example Verilog codes below.

Table 3 shows example conversions of AND logic, according to four state semantics.

| Convention 1 for a = b & c |
| --- |
| a_bin = b_bin & c_bin;<br>a_x = (b_x & c_x) \| (b_x & a_bin) \| (c_x & b_bin) = b_x & (c_x \| a_bin) \| (c_x & b_bin);<br>Convention 2 for a = b & c |
| a_1_possible = b_1_possible & c_1_possible;<br>a_0_possible = b_0_possible \| c_0_possible; |

Figure 6A:
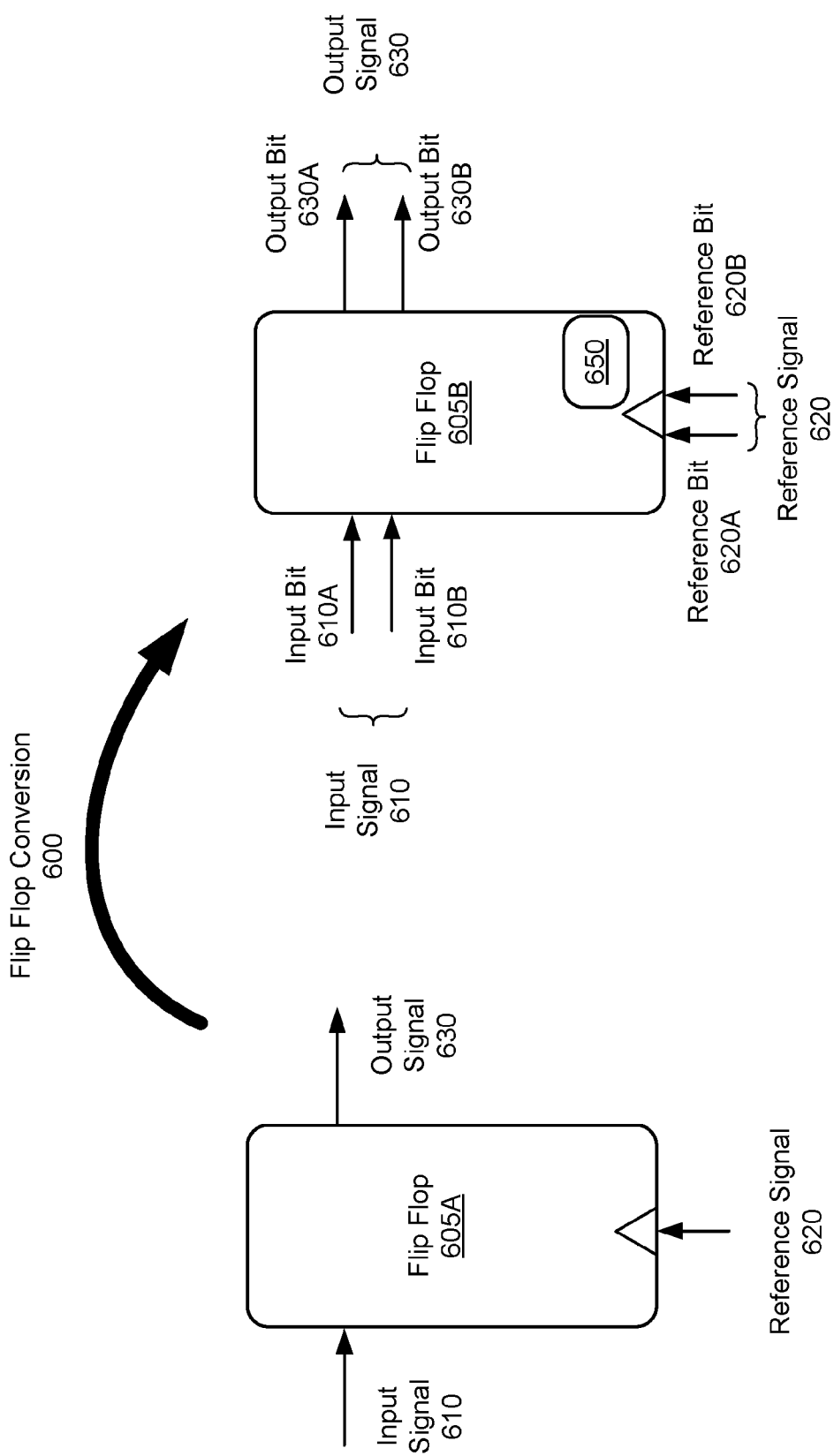
FIG. 6A is an example conversion of a flip flop, according to one embodiment.

In FIG. 6A, an example embodiment of a flip flop conversion 600 performed by the flip flop conversion module 330 is illustrated. A flip flop 605A in two state semantic generates an output signal 630 based on a rising edge or a falling edge of a reference signal 620 and an input signal 610 received prior to the transition of the state in the reference signal 620, where each signal is represented in a single bit. The flip flop conversion module 330 converts the flip flop 605A according to conversion rules such that a converted flip flop 605B is operable with signals having unknown states as well as a speculative transition in the reference signal 620.

The flip flop conversion 600 is performed such that the flip flop 605B receives an input signal 610 and the reference signal 620, and generates an output signal 630 in any one of the four state semantics as explained with respect to FIGS. 4A and 4B. According to a signal conversion 400, the input signal 610 is represented with input bits 610A, 610B, the reference signal 620 is represented with reference bits 620A, 620B, and the output signal 630 is represented with output bits 630A, 630B.

With signals converted to represent unknown states, the reference signal 620 may transition from an unknown state or to the unknown state, thereby causing a speculative transition with a rising edge or a falling edge. As an example, for a rising edge triggering flip flop 605B, a speculative transition may occur for a transition of the reference signal 620 from a low state to an unknown state (i.e., [0X]), or from an unknown state to a high state (i.e., [X1]). Similarly, for a falling edge triggering flip flop 605B, a speculative transition may occur for a transition of the reference signal 620 from a high state to an unknown state (i.e., [1X]) or from an unknown state to a low state (i.e., [X0]).

In one aspect, for a positive edge triggering flip flop 605B, the converted flip flop 605B implements a transition state bit 650 using an output of a register or a logic circuit for determining a speculative transition of the reference signal 620 from a low state to an unknown state. In case signals are converted according to the signal conversion 400A of FIG. 4A, the transition state bit 650 is obtained by performing AND operation on the reference bit 620A corresponding to reference signal_bin indicating a possible low state of the reference signal 620 and the reference bit 620B corresponding to reference signal_X indicating the state of the reference signal 620 is known. (e.g., transition state bit=(!reference signal_bin) & (!reference signal_X)=!(reference signal_bin | reference signal_X)). In case the reference signal 620 transitions from a low state to an unknown state (i.e., reference signal_X becomes high, when the transition state bit 650 was a high state), a state of the transition state bit 650 transitions to a low state. Hence, detecting a falling edge of the transition state bit 650 followed by the reference signal 620 in an unknown state, enables detecting a transition of the reference signal 620 from a low state to an unknown state.

For the positive edge triggering flip flop 605B, another speculative transition of the reference signal 620 may occur because of the reference signal 620 transitioning from an unknown state to a high state (i.e., [X1]). In one approach, determining the transition of the reference signal 620 from the unknown state to the high state is achieved by detecting a falling edge of reference signal_X, followed by reference signal_bin in a high state.

Once a speculative transition of the reference signal 620 is detected, the flip flop 605B may update a state of the output signal 630. In one aspect, responsive to detecting a speculative transition, uncertainty can be carried over onto the output signal 630. In case of a speculative transition, a current state of the output signal 630 is determined based on a state of the input signal 610 and a state of the output signal 630 prior to the speculative transition.

In one approach, a current state of the output signal 630 can be determined to be a combination of a state of the input signal 610 and a state of the output signal 630 prior to the speculative transition (e.g., {q}<=merge_emul(q, d) or {q_bin, q_x}<=merge_emul(q_bin, q_x, d_bin, d_x), where q is an output of the flip flop and d is an input of the flip flop). For example, if the input signal 610 of the flip flop 605B and the output signal 630 of the flip flop 605B prior to the speculative transition are in the same state, then the output signal 630 of the flip flop 605B is maintained after the speculative transition. Hence, the speculative transition of the reference signal 620 does not affect the output signal 630, when the input signal 610 and the output signal 630 prior to the speculative transition are in the same state. If the input signal 610 and the output signal 630 of the flip flop 605B prior to the speculative transition are in different states, then the output signal 630 of the flip flop 605B becomes unknown.

In addition to speculative transitions, the flip flop 605B operates based on a concrete transition of the reference signal 620. In one aspect, for a positive edge triggering flip flop 605B, determining a concrete transition of the reference signal 620 is based on the transition state bit 650. For example, a positive edge of the reference signal 620 is determined by detecting a falling edge of the transition state bit 650 followed by the reference signal 620 in a known state (e.g., high state) enables detection of a transition of the reference signal 620 from a low state to a high state (i.e., [01]).

One embodiment of the flip flop conversion 600 can be implemented according to an example Verilog code below.

Table 4 shows an example conversion of a flip flop, according to one of four state semantics.

Convention 1 for always @(posedge c) q <= d;

```
assign c__is__0 = (c__bin==0) & (c__x==0)
always @(negedge c__is__0 iff (c__x==1) or negedge c__x iff(c__bin==1))
begin
    { q__bin, q__x } <= merge__emul(q__bin, q__x, d__bin, d__x);
end
always @(negedge c__is__0 iff(c__x==0))
begin
    q__bin <= d__bin;
    q__x <= d__x;
end
```

Figure 6B:
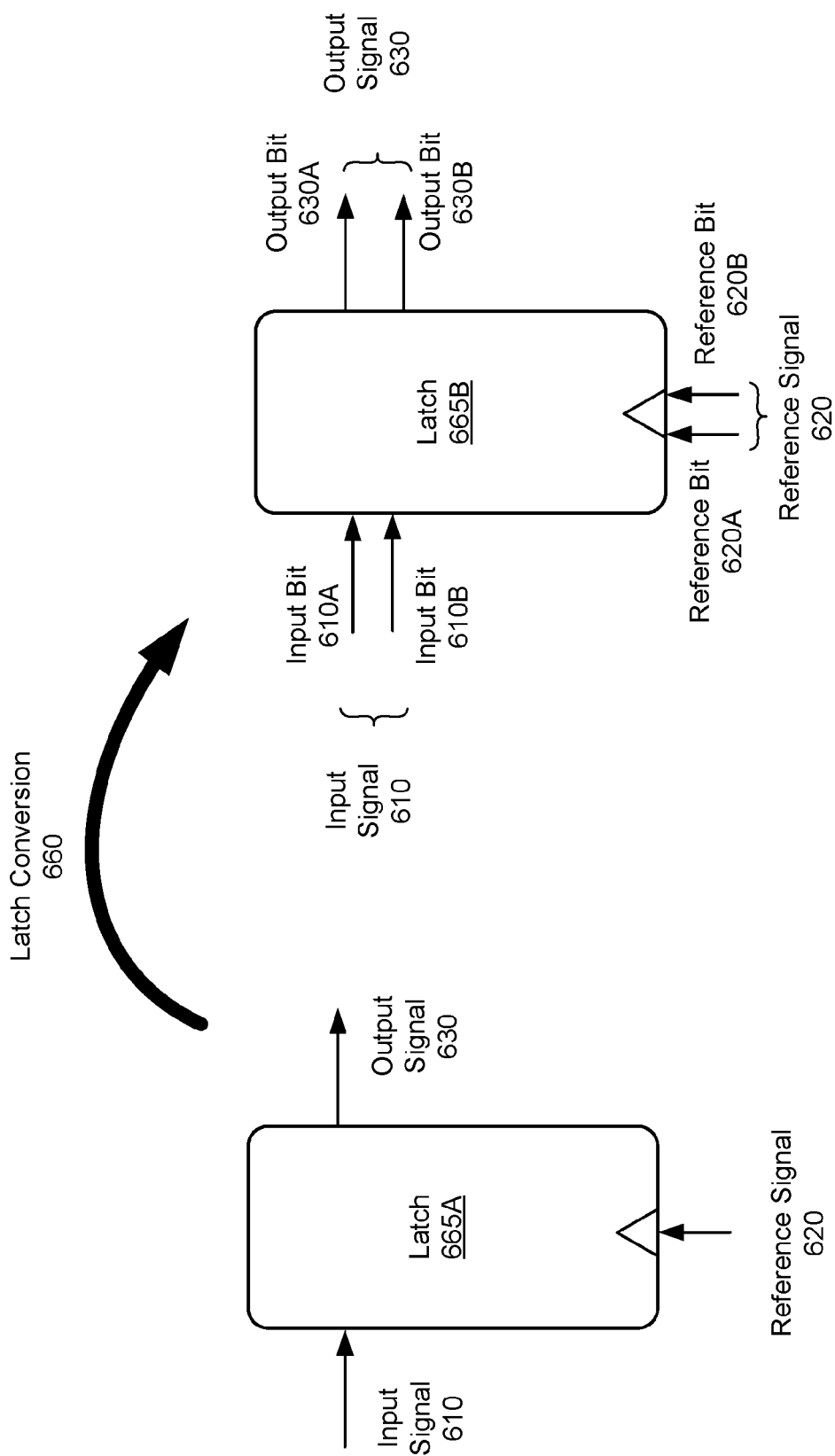
FIG. 6B is an example conversion of a latch, according to one embodiment.

In FIG. 6B, an example embodiment of a latch conversion 660 performed by the latch conversion module 335 is illustrated. A latch 665A in two state semantic generates an output signal 630 based on a state of a reference signal 620, where each signal is represented in a single bit. The latch conversion module 335 converts the latch 665A according to conversion rules such that a converted latch 665B is operable with signals having unknown states.

The latch conversion 660 is performed such that the latch 665B receives an input signal 610 and the reference signal 620, and generates an output signal 630 in any one of the four state semantics as explained with respect to FIGS. 4A and 4B. According to a signal conversion 400, the input signal 610 is represented with input bits 610A, 610B, the reference signal 620 is represented with reference bits 620A, 620B, and the output signal 630 is represented with output bits 630A, 630B. The operation of the latch 665B is similar to the flip flop 605B, except the latch 665B operates based on a state of the reference signal 620 rather than a transition in state of the reference signal 620, and transition state bit may not be implemented.

If a state of the reference signal 620 is unknown, the latch 665B may update a state of the output signal 630. In one aspect, responsive to detecting the reference signal 620 having an unknown state, uncertainty can be carried over onto the output signal 630. In case the reference signal 620 or the input signal 610 has an evaluation state (e.g., possible high state), the latch 665B performs evaluation. The output of the latch 665B can be continuously or discretely evaluated, when the reference signal 620 or the input signal 610 has an evaluation state. In case the state of the reference signal 620 is unknown during evaluation, a current state of the output signal 630 may be determined based on a state of the input signal 610 and a state of the output signal 630 received prior to an evaluation.

In one approach, the output signal 630 can be determined to be a combination of a state of the input signal 610 and a state of the output signal 630 prior to the evaluation (e.g., {q} <=merge_emul(q, d) or {q_bin, q_x}<=merge_emul (q_bin, q_x, d_bin, d_x), where q is an output of the latch and d is an input of the latch). For example, if the input signal 610 and the output signal 630 of the latch 665B prior to the evaluation are in the same state, then the output signal 630 of the latch 665B is maintained. Hence, the reference signal 620 having an unknown state does not affect the output signal 630, when the input signal 610 and the output signal 630 prior to the evaluation are in the same state. If the input signal 610 and the output signal 630 of the latch 665B prior to the evaluation are in different states, then the output signal 630 of the latch 665B becomes unknown.

The latch 665B also operates based on a concrete state of the reference signal 620. For example, responsive to detecting an evaluation state of the reference signal 620, an output signal 630 is updated according to an input signal 610 when the reference signal 620 is in the evaluation state.

One embodiment of the latch conversion 660 can be implemented according to an example Verilog code below.

Table 5 shows an example conversion of a latch, according to one of four state semantic.

Convention 1 for always @(c or d) if (c) q <= d;

```
always @(c or d) begin
    if (c === 1'bx)
        q <= merge (q, d);
    else if (c === 1'b1)
        q <= d;
end
```

Figure 7:
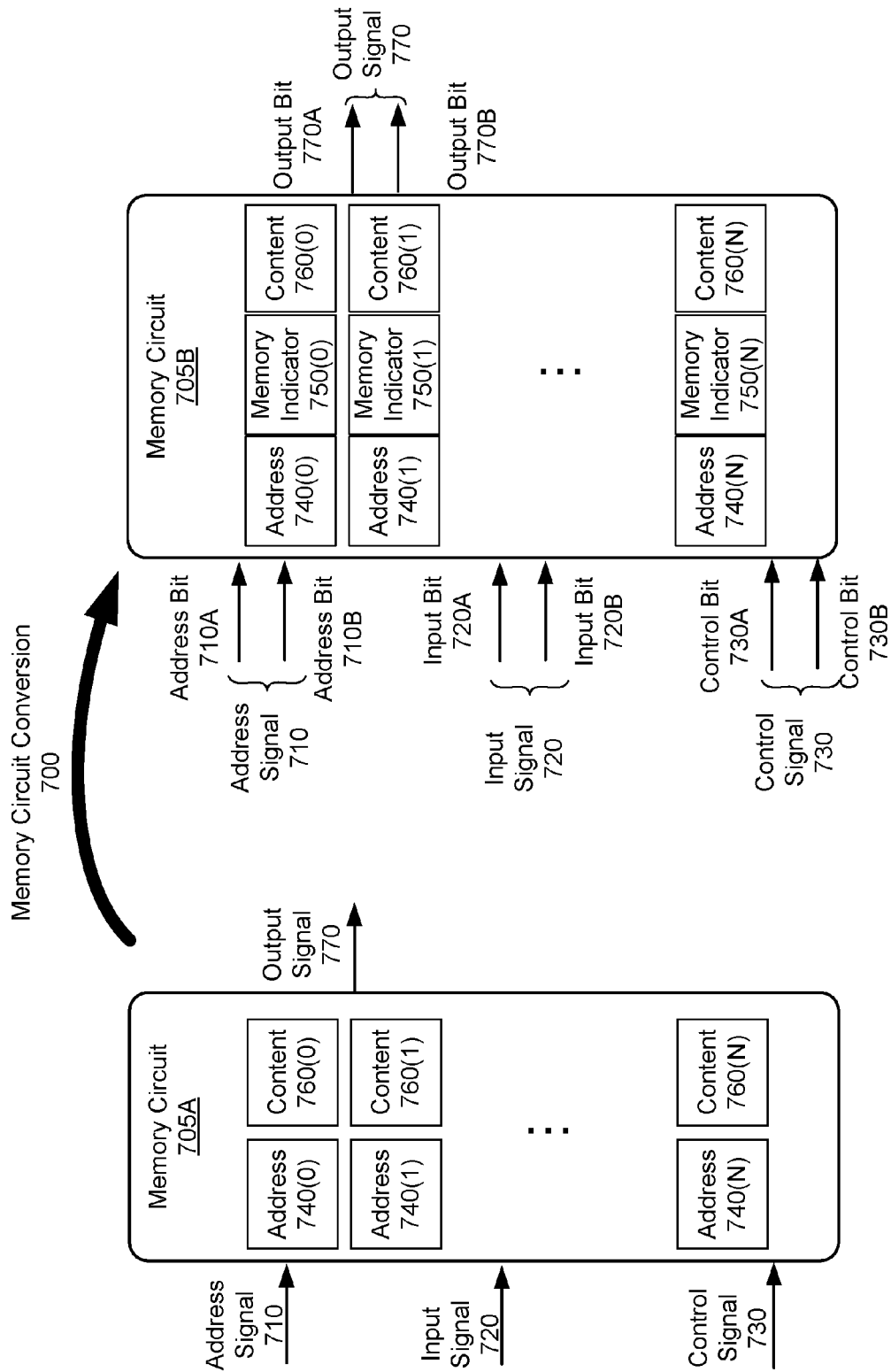
FIG. 7 is an example conversion of a memory circuit, according to one embodiment.

In FIG. 7, an example embodiment of a memory circuit conversion 700 performed by the memory circuit conversion module 340 is illustrated. The memory circuit 705A in two state semantic performs read and write operations based on an address signal 710 and a control signal 730. For the write operation, an input signal 720 is stored in the memory circuit 705A, and for the read operation, an output signal 770 is generated based on contents stored in the memory circuit 705A. The memory circuit conversion module 340 converts the memory circuit 705A according to conversion rules such that a converted memory circuit 705B is operable with signals having unknown states as well as an ambiguous address signal 710.

The memory circuit 705A in two state semantic includes contents 760(0), 760(1) . . . 760(N) (generally herein referred to as a content 760) for storing the input signal 720 received. Each content 760 is associated with a corresponding address 740 from addresses 740(0), 740(1) . . . 740(N) (generally herein referred to as an address 740). The control signal 730 indicates whether to perform a read operation or write operation. For the write operation, the input signal 720 is stored in a content 760 associated with a corresponding address 740 indicated by the address signal 710. For the read operation, the output signal 770 is generated based on a content 760 associated with a corresponding address 740 indicated by the address signal 710.

In one implementation, the memory circuit conversion 700 transforms the memory circuit 705A into a converted memory circuit 705B to be operable with signals having unknown states. The memory circuit conversion 700 is performed such that the memory circuit 705B receives the address signal 710, input signal 720, and control signal 730, and generates an output signal 770 in any one of the four state semantics as explained with respect to FIGS. 4A and 4B. In one aspect, each signal is represented in one or more bits. According to a signal conversion 400, each bit in the address signal 710 is represented with address bits 710A, 710B, each bit in the input signal 720 is represented with input bits 720A, 720B, each bit in the control signal 730 is represented with control bits 730A, 730B, and each bit in the output signal 770 is represented with output bits 770A, 770B.

With signals converted to represent unknown states, the address signal 710 may become ambiguous. Preferably, the address signal 710 is represented in multiple bits. When at least one of the bits is unknown, the address signal 710 becomes ambiguous. For example, in case the address signal 710 is represented in three bits and contains an unknown state [1X1], the address signal 710 may be referring to address [101] or [111], rendering contents 760 associated with the ambiguous address signal 710 to be unknown.

In one aspect, the converted memory circuit 705B implements memory indicators 750(0), 750(1) . . . 750(N) (generally herein referred to as a memory indicator 750) to indicate a content 760 associated with a corresponding address 740 is unknown. Each memory indicator 750 is associated with a corresponding address 740 and corresponding content 760. Preferably, each memory indicator 750 is implemented in a single bit.

For performing the write operation, when the address signal 710 is ambiguous, the memory circuit 705B identifies two or more candidate addresses 740 according to the address signal 710. Memory indicators 750 associated with the candidate addresses 740 indicated by the address signal 710 are activated (e.g., set to high states) to represent corresponding contents 760 associated with the memory indicators 750 are unknown. Preferably, storing the input signal 720 in the corresponding contents 760 associated with the memory indicators 750 is omitted (or bypassed). For example, an address signal 710 may be ambiguous with [1X1], and the memory circuit 705B identifies [101] and [111] as candidate addresses. In addition, the memory circuit 705B activates memory indicators 750 associated with the candidate addresses corresponding to and [111] to indicate contents associated with the candidate addresses [101] and [111] are unknown.

In case the address signal 710 is concrete (i.e., not ambiguous) and the input signal 720 is unknown, a memory indicator 750 associated with the address 740 indicated by the address signal 710 is activated. Similarly, storing the input signal 720 with the unknown state in the corresponding content 760 associated with the memory indicator 750 may be omitted (or bypassed).

For performing the read operation, when the address signal 710 is ambiguous, in one embodiment, the memory circuit 705B generates the output signal 770 with an unknown state, and bypasses reading any content 760. In one implementation, the memory circuit 705B identifies two or more candidate addresses 740 according to the address signal 710. In another implementation, the memory circuit 705B omits identifying candidate addresses 740 according to the address signal 710.

In addition for performing the read operation, in case the address signal 710 is concrete (i.e., not ambiguous) and a memory indicator 750 associated with a corresponding address 740 indicated by the address signal 710 is activated, the memory circuit 705B generates the output signal 770 with an unknown state, and bypasses reading any content 760.

The memory circuit 705B also performs read and write operations with signals in known states. For the write operation, the memory circuit 705B stores the input signal 720 in a content 760 associated with a corresponding address 740 indicated by the address signal 710. For the read operation, the memory circuit 705B generates the output signal 770 based on a content 760 associated with a corresponding address 740 indicated by the address signal 710.

By indicating a certainty of a content 760 associated with a memory indicator 750 in a single bit, read and write operations speed can be improved. Preferably, a content 760 includes multiple bits in the memory circuit 705B, hence performing read and write operations may be accompanied with high latencies. As a result, eschewing the actual read and write operations for an ambiguous address signal 710 or an ambiguous input signal 720 allows faster read and write operations of the memory circuit 705B.

In one aspect, all memory indicators 750 are activated during an initialization of the memory circuit 705B to indicate all contents 760 stored are unknown. Therefore, without a concrete memory assignment (i.e., a write operation with a concrete address signal 710 and a known input signal 720), one or more memory indicators 750 remain activated. Preferably, after a concrete memory assignment, the memory indicator 750 is deactivated (e.g., set to a low state). As a result, uninitialized memory address can be easily identified to promote a rigorous design practice.

Beneficially, initializing signals according the four state semantic can represent family of unknown values instead of a specific single assignment. Thus, an unknown operation of the DUT can be exposed, while a random initialization approach exercising a particular value assignment may not lead to a problem manifestation.

Representing an unknown state of a signal and propagating the unknown state can achieve speed improvement in identifying improper or unknown operations of a DUT, for example, due to power shut down or improper initialization. With billions of logic circuits implemented in a recent process (e.g., 22 nm and below), identifying improper or unknown operations of a DUT in the two state semantic may be achieved in 1 million emulated cycles. In contrast, with a capability to represent an unknown state of a signal in the four state semantic and propagating the unknown state, identifying improper or unknown operations of a DUT can be achieved within 1000 emulated cycles.

Additionally, a DUT in the four state semantic can be implemented with conventional digital circuit blocks without employing a customized analog/mixed signal circuitries (e.g., a tri-state buffer). As a result, conversion of the DUT can be achieved at a relatively low cost. Furthermore, a portion of the DUT may be implemented in the four state logic, when another portion of the DUT is implemented in the two state logic seamlessly.

In addition, IP/block level hardware components of a DUT causing failure may be identified. Because a portion of a DUT may be converted into the four state semantic, predefined IP/block level components or regions or logic circuits selected by a user can be further examined to isolate root cause of a problem far more rapidly in terms of number of emulated cycles. Hence, hardware resources for implementing a portion of the DUT in the four state semantic remains at a reasonable level not to overburden the emulator 120.

Figure 8:
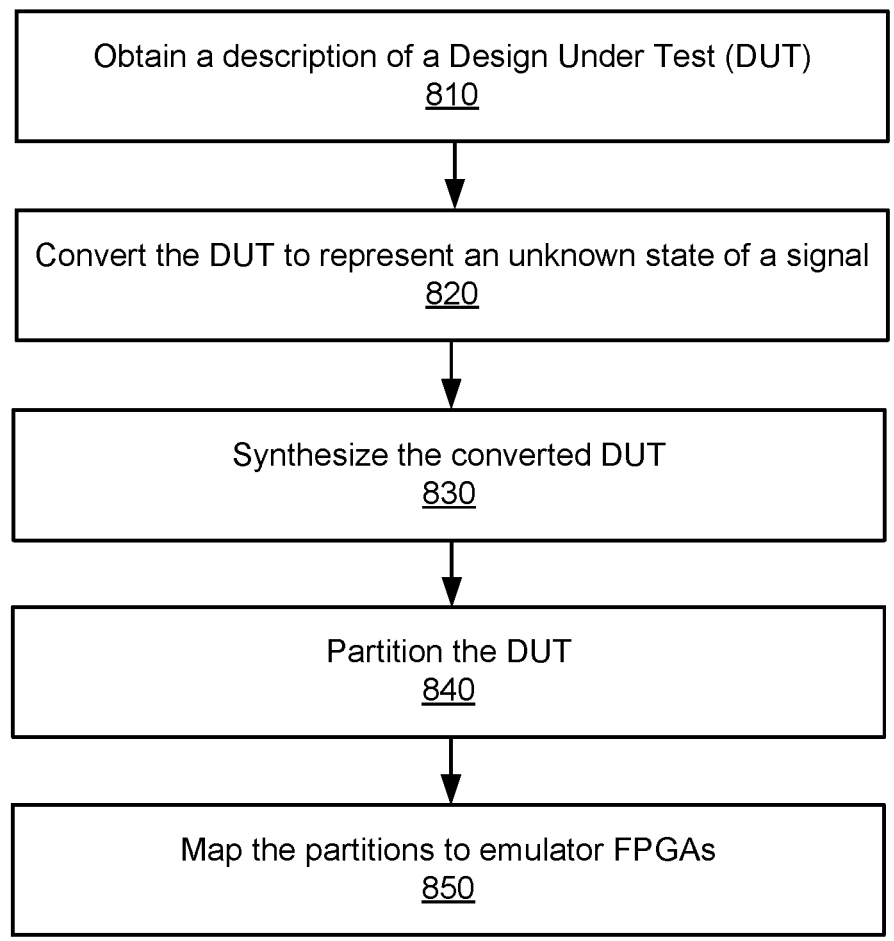
FIG. 8 is a flow chart illustrating the host system preparing, for emulation, a device under test (DUT) converted to represent an unknown state of a digital signal, according to one embodiment.

FIG. 8 is a flow chart illustrating the host system 110 preparing, for emulation, a device under test (DUT) converted to represent an unknown state of a digital signal, according to one example embodiment. Other embodiments can perform the steps of FIG. 8 in different orders. Moreover, other embodiments can include different and/or additional steps than the ones described here.

The host system 110 obtains 810 from a user a description of a DUT in HDL. The host system 110 converts 820 the DUT to represent an unknown state of a signal. The host system 110 synthesizes 830 the HDL description of the converted DUT to create a gate level netlist. In another embodiment, instead of converting the DUT prior to synthesizing, the DUT is converted after synthesizing the HDL description of the DUT.

The host system 110 partitions 840 the DUT at the gate level into a number of partitions using the gate level netlist. The host system 110 maps 850 each partition to one or more FPGAs of the emulator 120.

Figure 9:
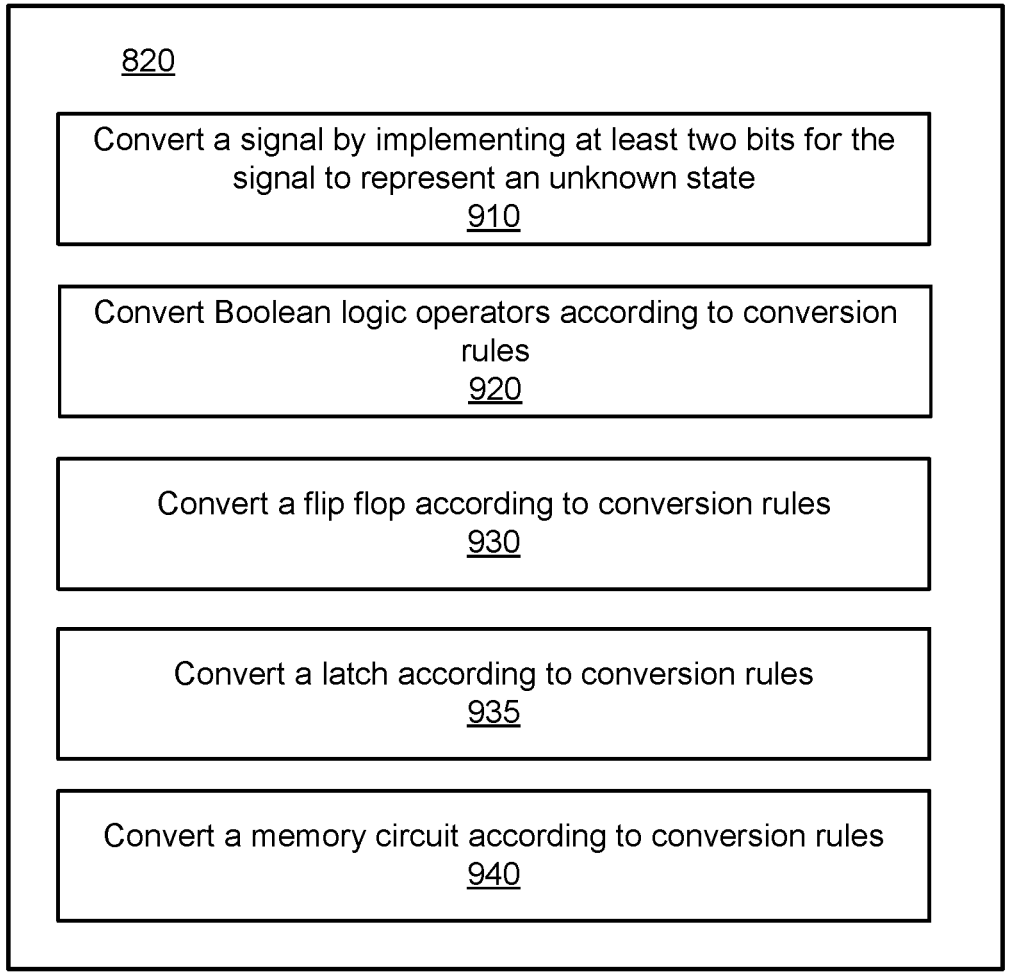
FIG. 9 illustrates conversions performed on the DUT, according to one embodiment.

In FIG. 9, conversions 820 of the DUT performed by the host system 110 are illustrated. The host system 110 converts 910 a signal according to conversion rules in a form capable of representing an unknown state of the signal. In one aspect, the signal is converted into a four state semantic by implementing at least two bits for each bit in the signal. In addition, the host system 110 converts 920 a Boolean logic operator 505A according to conversion rules to determine output signals 530 of the converted Boolean logic operator 505B and uncertainties of the output signals 530 based on input signals 510 representing unknown states. Additionally, the host system 110 converts 930 a flip flop 605A according to conversion rules. The converted flip flop 605B is operable with a speculative transition including a transition in a state of a reference signal 620 from an unknown state or to the unknown state. Furthermore, the host system 110 converts 935 a latch 665A according to conversion rules. The converted latch 665B is operable with a reference signal 620 having an unknown state. Moreover, the host system 110 converts 940 a memory circuit 705A according to conversion rules. The converted memory circuit 705B is operable with an ambiguous address signal 710 or an ambiguous input signal 720 including at least one bit having an unknown state.

Figure 10:
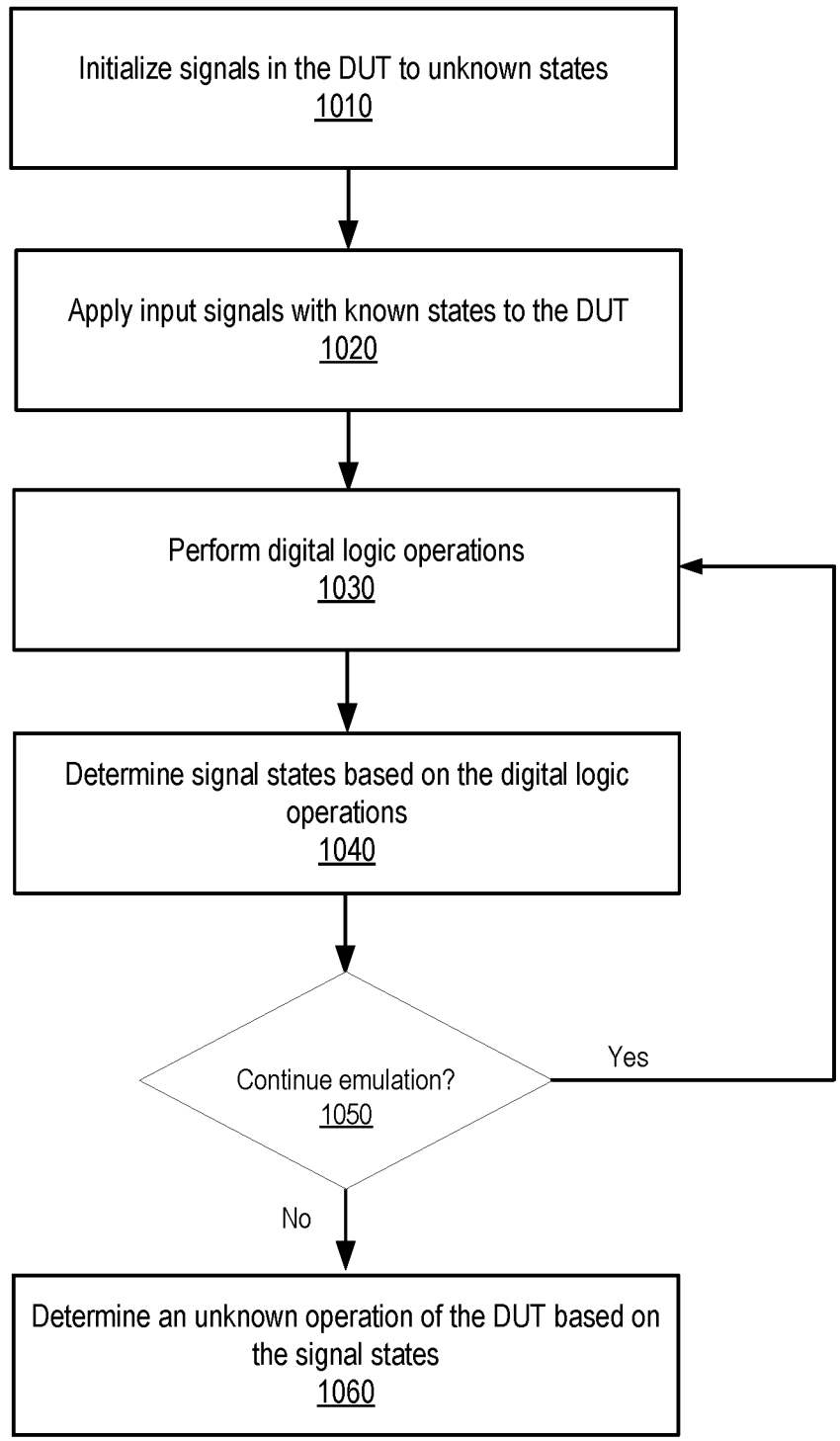
FIG. 10 is a flow chart illustrating the emulator performing digital logic operations to identify an unknown operation of the DUT based on signal states, according to one embodiment.

In FIG. 10, illustrated is a flow chart for the emulator 120 performing digital logic operations to identify an unknown operation of the DUT based on signal states, according to one embodiment. Preferably, the DUT is converted by the host system 110 in a form capable of representing an unknown state of a signal in the DUT. Other embodiments can perform the steps of FIG. 10 in different orders. Moreover, other embodiments can include different and/or additional steps than the ones described here. Furthermore, other embodiments may omit certain steps described here.

In the initialization step, signals in the DUT are initialized 1010 or set to unknown states. For example in the memory circuit 705B, memory indicators 750 are activated to indicate contents 760 in the memory circuit 705B are unknown. Additionally, states of other signals or logic circuits may be initialized to unknown states. During the initialization step or turning the DUT on after a power shut down, a subset of signals or all signals of the DUT would be assigned to have unknown states.

The emulator 120 applies 1020 input signals with known states to the DUT. A portion of the input signals may have unknown states. The emulator 120 performs 1030 digital logic operations based on the input signals, and determines 1040 signal states based on the digital logic operations performed 1030. Results of the digital logic operations may be used to perform additional digital logic operations, hence unknown states may be propagated for improper or unknown operations of the DUT. The emulator 120 may continue 1050 emulation in another emulation cycle with updated input signals for at least a predetermined number of cycles.

For a properly designed DUT, the DUT is expected to recover from signals having unknown states, for example due to power shut down. Hence, outputs of the DUT are expected to have well-defined states after the predetermined number of cycles. The predetermined number of cycles can be obtained by a design choice or through simulations of the DUT. After emulating the DUT for at least the predetermined number of cycles, the output of the DUT is monitored, and an unknown operation of the DUT can be determined 1060 based on the output signals.

Referring to FIG. 11, illustrated is a flow chart for the emulator 120 operating a flip flop 605B or a latch 665B according to one embodiment. Preferably, the flip flop 605B or the latch 665B is converted by the host system 110 in a form capable of representing an unknown state of a signal in the DUT. Thus, the flip flop 605B is operable with a speculative transition in a reference signal 620 and the latch 665B is operable with the reference signal 620 having an unknown state. Other embodiments can perform the steps of FIG. 11 in different orders. Moreover, other embodiments can include different and/or additional steps than the ones described here. Furthermore, other embodiments may omit certain steps described here.

The flip flop 605B or the latch 665B receives 1110 an input signal 610 and a reference signal 620. In one approach, the input signal 610 and the reference signal 620 are represented in a four state semantic.

The flip flop 605B or the latch 665B monitors 1120 for a speculative condition. For the flip flop 605B, the speculative condition may be a speculative transition in the reference signal 620. For the latch 665B, the speculative condition may be the reference signal 620 having an unknown state in case the reference signal 620 or the input signal 610 having an evaluation state (e.g., possible high state). In one aspect, responsive to detecting the speculative condition, the flip flop 605B or the latch 665B generates 1150 an output signal based on the input signal 610 and the output signal 630 prior to the speculative condition. Thus, uncertainty can be carried over onto the output signal 630.

In addition, the flip flop 605B or the latch 665B monitors 1140 for a concrete condition in the reference signal 620. For a positive edge triggered flip flop 605B, the concrete condition may be the reference signal 620 transitioning from a low state to a high state. For the latch 665B, the concrete condition may be the reference signal 620 having an evaluation state (e.g., high state). For a flip flop 605B, if a concrete condition of the reference signal 620 is detected, the flip flop 605B generates 1160 the output signal 630 based on the input signal 610 prior to the concrete transition of the reference signal 620. For a latch 665B, if a concrete condition of the reference signal 620 is detected, the latch 665B generates 1160 the output signal 630 based on the input signal 610 received when the reference signal 620 has the concrete evaluation state.

If neither speculative condition nor a concrete condition of the reference signal 620 is detected, the flip flop 605B or the latch 665B maintains 1170 the output signal 630.

Figure 12A:
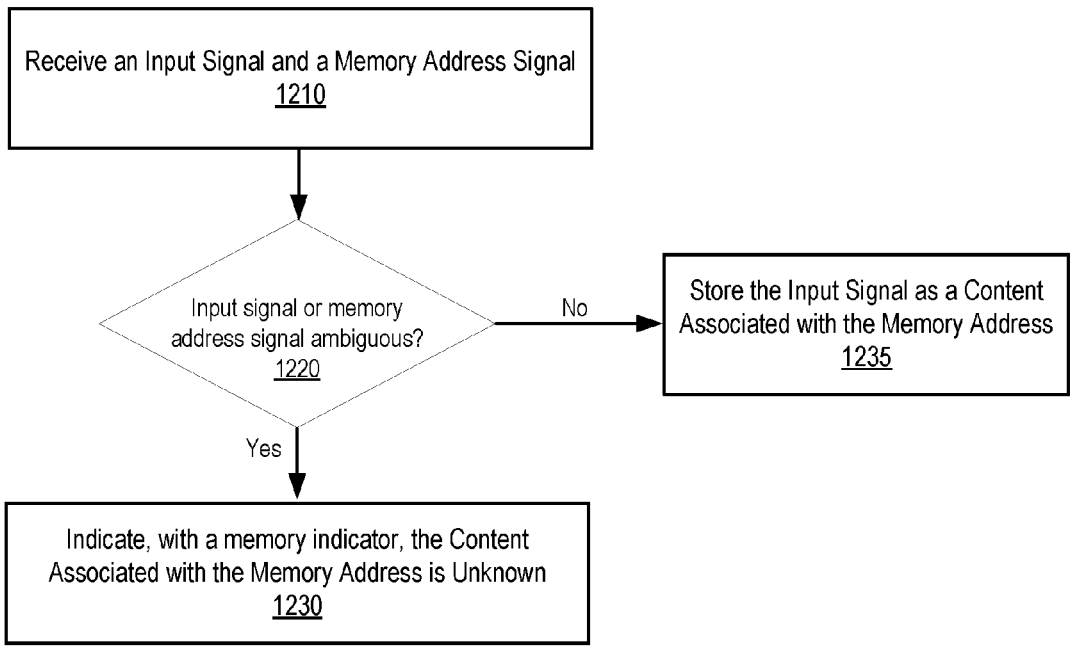
FIG. 12A is a flow chart illustrating a memory write operation performed by the emulator, according to one embodiment.
Figure 12B:
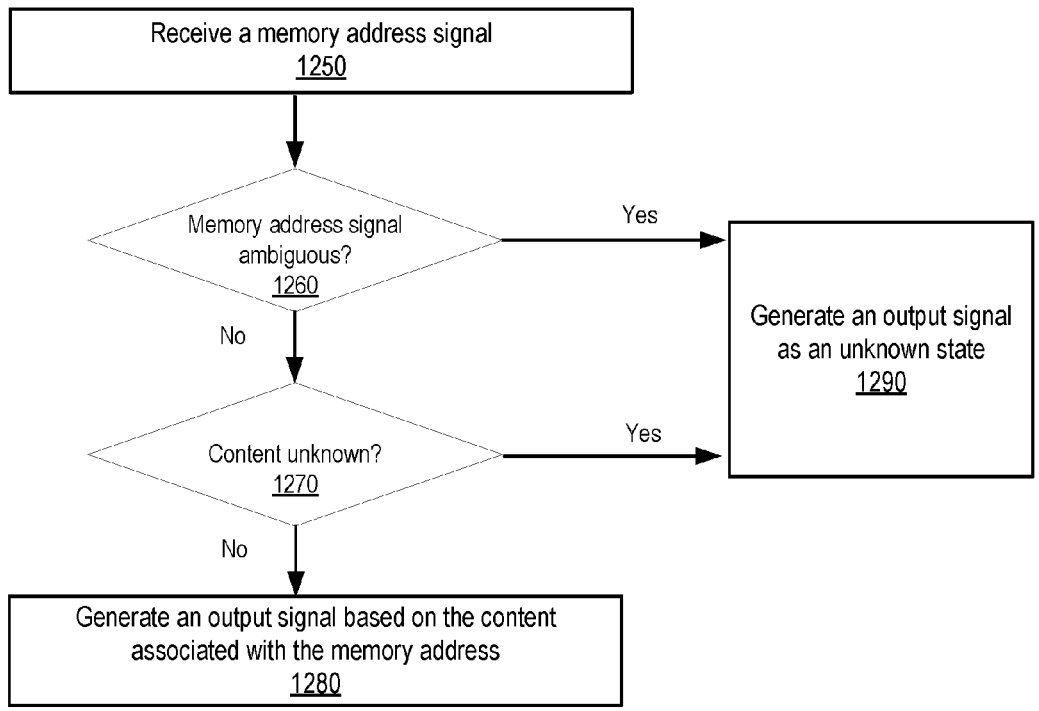
FIG. 12B is a flow chart illustrating a memory read operation performed by the emulator, according to one embodiment.

Referring to FIGS. 12A and 12B, illustrated is a flow chart for the emulator 120 operating a memory circuit 705B according to one embodiment. Preferably, the memory circuit 705B is converted by the host system 110 in a form capable of representing an unknown state of a signal in the DUT. Hence the memory circuit 705B is operable with an ambiguous address signal 710. Other embodiments can perform the steps of FIGS. 12A and 12B in different orders. Moreover, other embodiments can include different and/or additional steps than the ones described here. Furthermore, other embodiments may omit certain steps described here.

FIG. 12A illustrates the emulator 120 performing a write operation on the memory circuit 705B, according to one embodiment. The memory circuit 705B receives 1210 an input signal 720 and an address signal 710. The memory circuit 705B determines 1220 whether the input signal 720 or the address signal 710 is ambiguous. Responsive to determining that the input signal 720 and the address signal 710 are concrete, the memory circuit 705B stores 1235 the input signal 720 in a content 760 associated with the address 740 indicated by the address signal 710. Responsive to determining that at least one of the input signal 720 and the address signal 710 is ambiguous, the memory circuit 705B indicates 1230, with a memory indicator 750, the content 760 associated with the address 740 indicated by the address signal 710 is unknown. In one example, the memory circuit 705B identifies candidate addresses 740 according to the address signal 710. In one approach, the memory indicator 750 is activated to indicate the content 760 is unknown, and preferably storing the input signal 720 in the content 760 is omitted.

FIG. 12B illustrates the emulator 120 performing a read operation on the memory circuit 705B, according to one embodiment. The memory circuit 705B receives 1250 an address signal 710, and the memory circuit 705B determines 1260 whether the address signal 710 is ambiguous. Responsive to determining that the address signal 710 is ambiguous, the memory circuit 705B generates 1290 an output signal 770 having an unknown state. Preferably, actual of reading of the content 760 is omitted (or bypassed).

Responsive to determining that the address signal 710 is concrete, the memory circuit 705B determines 1270 whether content 760 associated with an address 740 indicated by the address signal 710 is unknown. In one approach, the memory circuit 705B examines a memory indicator 750 associated with the content 760 and associated with the address 740 to determine whether the content 760 is unknown. For example, if the memory indicator 750 is activated, then the content 760 is determined to be unknown. Furthermore, responsive to determining that the content 760 is unknown, the memory circuit 705B generates 1290 the output signal 770 having an unknown state. Preferably actual of reading of the content 760 is omitted (or bypassed).

Responsive to determining that the content 760 is known, the memory circuit 705B generates 1280 the output signal 770 based on the content 760 associated with the address 740 indicated by the address signal 710.

Computing Machine Architecture

Figure 13:
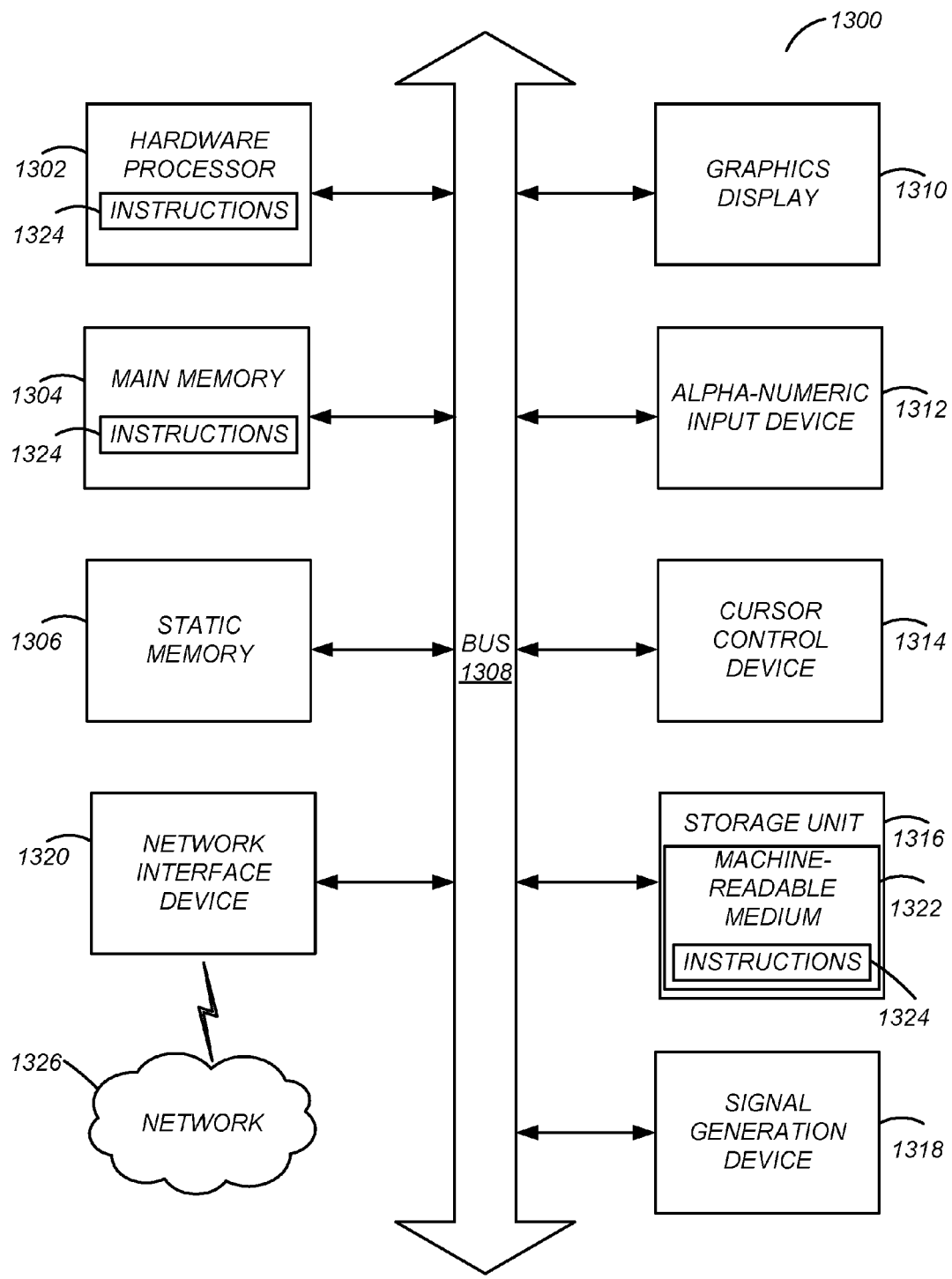
FIG. 13 illustrates one embodiment of components of an example machine able to read instructions from a machine-readable medium and execute them in a processor (or controller).

Turning now to FIG. 13, it is a block diagram illustrating components of an example machine able to read instructions from a machine-readable medium and execute them in a processor (or controller). Specifically, FIG. 13 shows a diagrammatic representation of a machine in the example form of a computer system 1300 within which instructions 1324 (e.g., software or program code) for causing the machine to perform (execute) any one or more of the methodologies described with FIGS. 1-12. The computer system 1300 may be used for one or more of the entities (e.g., host system 110, emulator 120) illustrated in the emulation environment 100 of FIG. 1.

The example computer system 1300 includes a hardware processor 1302 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 1304, and a static memory 1306, which are configured to communicate with each other via a bus 1308. The processor 1302 may include one or more processors. The computer system 1300 may further include graphics display unit 1310 (e.g., a plasma display panel (PDP), a liquid crystal display (LCD), a projector, or a cathode ray tube (CRT)). The computer system 1300 may also include alphanumeric input device 1312 (e.g., a keyboard), a cursor control device 1314 (e.g., a mouse, a trackball, a joystick, a motion sensor, or other pointing instrument), a storage unit 1316, a signal generation device 1318 (e.g., a speaker), and a network interface device 1320, which also are configured to communicate via the bus 1308.

The storage unit 1316 includes a machine-readable medium 1322 on which is stored instructions 1324 (e.g., software) embodying any one or more of the methodologies or functions described herein. The instructions 1324 (e.g., software) may also reside, completely or at least partially, within the main memory 1304 or within the processor 1302 (e.g., within a processor's cache memory) during execution thereof by the computer system 1300, the main memory 1304 and the processor 1302 also constituting machine-readable media. The instructions 1324 (e.g., software) may be transmitted or received over a network 1326 via the network interface device 1320.

While machine-readable medium 1322 is shown in an example embodiment to be a single medium, the term "machine-readable medium" should be taken to include a single medium or multiple media (e.g., a centralized or distributed database, or associated caches and servers) able to store instructions (e.g., instructions 1324). The term "machine-readable medium" shall also be taken to include any medium that is capable of storing instructions (e.g., instructions 1324) for execution by the machine and that cause the machine to perform any one or more of the methodologies disclosed herein. The term "machine-readable medium" includes, but not be limited to, data repositories in the form of solid-state memories, optical media, and magnetic media.

As is known in the art, a computer system 1300 can have different and/or other components than those shown in FIG. 13. In addition, the computer system 1300 can lack certain illustrated components. For example, a computer system 1300 acting as the emulator 120 may include a hardware processor 1302, a storage unit 1316, a network interface device 1320, and multiple configurable logic circuits (as described above with reference to FIG. 1), among other components, but may lack an alphanumeric input device 1312 and a cursor control device 1314.

Additional Configuration Considerations

It is noted that although the subject matter is described in the context of emulation environment for emulation of digital circuits and systems, the principles described may be applied to analysis of any digital electronic devices. Advantages of the disclosed configurations include transforming signals and digital logic circuits in a form capable of representing an unknown state. In this manner, an unknown state may be propagated to other logic circuits, hence improper or unknown operations of a DUT, for example due to power shut down or improper initialization, may be identified in a computation efficient manner. Moreover, while the examples herein are in the context of an emulation environment, the principles described herein can apply to other analysis of hardware implementations of digital circuitries, including FPGA and ASIC or software simulation such as EDAs.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms, for example, as illustrated in FIGS. 1-12. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

The various operations of example methods described herein may be performed, at least partially, by one or more processors, e.g., processor 1302, that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for a representation and propagation of unknown states of signals through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A non-transitory computer readable medium storing instructions for semantic conversion in at least a portion of a design under test (DUT) for an emulation on an emulation system comprising a representation of a digital logic circuit and a representation of a memory device that includes content for storing a state of an input signal to be instantiated in a hardware programmable logic on the emulation system, the instructions when executed by a processor cause the processor to:
 convert, according to at least one conversion rule, the hardware programmable logic from a two state semantic having one of a high state and a low state using one bit into a four state semantic having one of the high state, the low state, and unknown states using two bits to generate an output based on the four state semantic, wherein the representation of the memory device converted into the four state semantic includes a memory indicator associated with the content and an address signal to indicate the content being unknown in response to the input signal or the address signal being unknown; and
 during the emulation of the DUT on the emulation system, propagate at least one of the unknown states through digital logic of at least the portion of the DUT represented in the four state semantic including the representation of the digital logic circuit converted into the four state semantic and the representation of the converted memory device.

2. The non-transitory computer readable medium of claim 1, wherein the representation of the digital logic circuit represented in the two state semantic comprises at least one of: a representation of Boolean logic, a representation of a flip flop, and a representation of a latch.

3. The non-transitory computer readable medium of claim 2, wherein the representation of the flip flop converted into the four state semantic is operable with a speculative transition of a reference signal, the speculative transition including a transition of a state of the reference signal from one of the unknown states or to one of the unknown states, the representation of the converted flip flop to generate a current state of an output of the representation of the converted flip flop based on a state of an input of the representation of the converted flip flop and a state of the output of the representation of the converted flip flop prior to the speculative transition of the reference signal in response to detecting the speculative transition of the reference signal.

4. The non-transitory computer readable medium of claim 2, wherein
 the representation of the latch converted into the four state semantic is operable with a reference signal having one of the unknown states, the representation of the converted latch to generate a current state of an output of the representation of the converted latch based on a state of an input of the representation of the converted latch and a state of the output of the representation of the converted latch prior to generating the output in response to detecting the reference signal having one of the unknown states.

5. The non-transitory computer readable medium of claim 1, wherein the representation of the converted memory device is configured to bypass storing the input signal in response to the input signal or the address being unknown.

6. The non-transitory computer readable medium of claim 1, wherein the representation of the converted memory device is configured to generate an output signal having one of the unknown states for the content associated with the address signal without reading the content for performing a memory read operation in response to the memory indicator associated with the address signal indicating the content being unknown.

7. The non-transitory computer readable medium of claim 1, wherein the instructions when executed by the processor further cause the processor to:
 convert, according to at least one conversion rule, the hardware programmable logic from the two state semantic into the four state semantic at a gate level.

8. The non-transitory computer readable medium of claim 1, wherein the instructions when executed by the processor further cause the processor to:
 propagate, during the emulation of the DUT on the emulation system, the at least one of the unknown states through the digital logic of at least the portion of the DUT represented in the four state semantic by performing a digital logic operation using the representation of the converted digital logic circuit.

9. The non-transitory computer readable medium of claim 1, wherein the instructions when executed by the processor further cause the processor to:
 generate, responsive to the input signal of the representation of the converted memory device or the address signal of the representation of the converted memory device being unknown, an output signal of the representation of the converted memory device as being unknown for the content; and
 propagate, during the emulation of the DUT on the emulation system, the at least one of the unknown states through the digital logic of at least the portion of the DUT represented in the four state semantic by performing a digital logic operation using the representation of the converted digital logic circuit according to the output signal of the representation of the converted memory device.

10. The non-transitory computer readable medium of claim 1, wherein one of the unknown states is an unassigned state.

11. A computer implemented method for semantic conversion in at least a portion of a design under test (DUT) for an emulation on an emulation system comprising a representation of a digital logic circuit and a representation of a memory device that includes content for storing a state of an input signal to be instantiated in a hardware programmable logic on the emulation system, the method comprising:
 converting, according to at least one conversion rule, the hardware programmable logic from a two state semantic having one of a high state and a low state using one bit into a four state semantic having one of the high state, the low state, and unknown states using two bits to generate an output based on the four state semantic, wherein the representation of the memory device converted into the four state semantic includes a memory indicator associated with the content and an address signal to indicate the content being unknown in response to the input signal or the address signal being unknown; and
 during the emulation of the DUT on the emulation system, propagating at least one of the unknown states through digital logic of at least the portion of the DUT represented in the four state semantic including the representation of the digital logic circuit converted into the four state semantic and the representation of the converted memory device.

12. The method of claim 11, wherein the representation of the digital logic circuit represented in the two state semantic comprises at least one of: a representation of Boolean logic, a representation of a flip flop, and a representation of a latch.

13. The method of claim 12, wherein
the representation of the flip flop converted into the four state semantic is operable with a speculative transition of a reference signal, the speculative transition including a transition of a state of the reference signal from one of the unknown states or to one of the unknown states, the representation of the converted flip flop to generate a current state of an output of the representation of the converted flip flop based on a state of an input of the representation of the converted flip flop and a state of the output of the representation of the converted flip flop prior to the speculative transition of the reference signal in response to detecting the speculative transition of the reference signal.

14. The method of claim 12, wherein
the representation of the latch converted into the four state semantic is operable with a reference signal having one of the unknown states, the representation of the converted latch to generate a current state of an output of the representation of the converted latch based on a state of an input of the representation of the converted latch and a state of the output of the representation of the converted latch prior to generating the output in response to detecting the reference signal having one of the unknown states.

15. The method of claim 11, further comprising:
bypassing storing the input signal in response to the input signal or the address signal being unknown.

16. The method of claim 11, further comprising:
generating an output signal having one of the unknown states for the content associated with the address signal without reading the content for performing a memory read operation in response to the memory indicator associated with the address signal indicating the content being unknown.

17. The method of claim 11, further comprising:
converting, according to at least one conversion rule, the hardware programmable logic from the two state semantic into the four state semantic at a gate level.

18. The method of claim 11, further comprising:
propagating, during the emulation of the DUT on the emulation system, the at least one of the unknown states through the digital logic of at least the portion of the DUT represented in the four state semantic by performing a digital logic operation using the representation of the converted digital logic circuit.

19. The method of claim 11, further comprising:
generating, responsive to the input signal of the representation of the converted memory device or the address signal of the representation of the converted memory device being unknown, an output signal of the representation of the converted memory device as being unknown for the content; and
propagating, during the emulation of the DUT on the emulation system, the at least one of the unknown states through the digital logic of at least the portion of the DUT represented in the four state semantic by performing a digital logic operation using the representation of the converted digital logic circuit according to the output signal of the representation of the converted memory device.

20. The method of claim 11, wherein one of the unknown states is an unassigned state.

* * * * *